United States Patent
Campbell

(10) Patent No.: US 9,768,770 B2
(45) Date of Patent: Sep. 19, 2017

(54) BIAS CIRCUIT FOR A HIGH POWER RADIO FREQUENCY SWITCHING DEVICE

(71) Applicant: TriQuint Semiconductor, Inc., Hillsboro, OR (US)

(72) Inventor: Charles F. Campbell, McKinney, TX (US)

(73) Assignee: Qorvo US, Inc., Greensboro, NC (US)

( * ) Notice: Subject to any disclaimer, the term of this patent is extended or adjusted under 35 U.S.C. 154(b) by 646 days.

(21) Appl. No.: 14/196,987

(22) Filed: Mar. 4, 2014

(65) Prior Publication Data

US 2015/0256172 A1 Sep. 10, 2015

(51) Int. Cl.
*H03K 17/00* (2006.01)
*H03K 17/687* (2006.01)
*H03K 17/16* (2006.01)

(52) U.S. Cl.
CPC ......... *H03K 17/687* (2013.01); *H03K 17/161* (2013.01); *H03K 2217/0054* (2013.01); *Y10T 307/747* (2015.04); *Y10T 307/937* (2015.04)

(58) Field of Classification Search
USPC ........................................................ 307/113
See application file for complete search history.

(56) References Cited

U.S. PATENT DOCUMENTS

| 7,755,222 B2* | 7/2010 | Heston | H03K 17/102 307/128 |
| 8,923,782 B1* | 12/2014 | Ravindran | H01L 25/18 257/368 |
| 2005/0179506 A1* | 8/2005 | Takahashi | H04B 1/48 333/104 |
| 2007/0159230 A1 | 7/2007 | Heston et al. | |
| 2010/0013571 A1* | 1/2010 | Arell | H03K 17/165 333/103 |
| 2012/0313709 A1* | 12/2012 | Lautzenhiser | H03F 1/301 330/285 |
| 2014/0009214 A1* | 1/2014 | Altunkilic | H03K 17/161 327/427 |
| 2014/0043110 A1* | 2/2014 | Kobori | H04B 1/48 333/103 |
| 2015/0256172 A1* | 9/2015 | Campbell | H03K 17/687 307/113 |

FOREIGN PATENT DOCUMENTS

WO 2007081973 A2 7/2007

* cited by examiner

*Primary Examiner* — Ronald W Leja
(74) *Attorney, Agent, or Firm* — Withrow & Terranova, P.L.L.C.

(57) ABSTRACT

Embodiments provide a switching circuit including a transistor and a bias circuit. The transistor may transition between an off state and an on state responsive to a control signal received at a control terminal. The bias circuit may be coupled between the control terminal and a gate terminal of the transistor. The bias circuit may include a gate resistor coupled between the gate terminal and the control terminal. The bias circuit may further include one or more diodes coupled in parallel with the gate resistor between the gate terminal and the control terminal to allow leakage current to pass from the gate terminal through the one or more diodes. In some embodiments, the bias circuit may include a switch coupled with the one or more diodes to selectively couple the one or more diodes in parallel with the gate resistor when the transistor is off.

17 Claims, 4 Drawing Sheets

BIAS CIRCUIT FOR A HIGH POWER RADIO FREQUENCY SWITCHING DEVICE

FIELD

Embodiments of the present disclosure relate generally to the field of circuits, and more particularly to a bias circuit for a radio frequency switching device.

BACKGROUND

Radio frequency (RF) switching devices are used in many applications, such as in wireless communication systems, to selectively pass an RF signal. Many switching devices include a field effect transistor (FET) to switch the RF signal. However, leakage current at a gate terminal of the FET can cause insertion loss and/or cause the FET to turn on or off when not desired.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C), or (A, B, and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
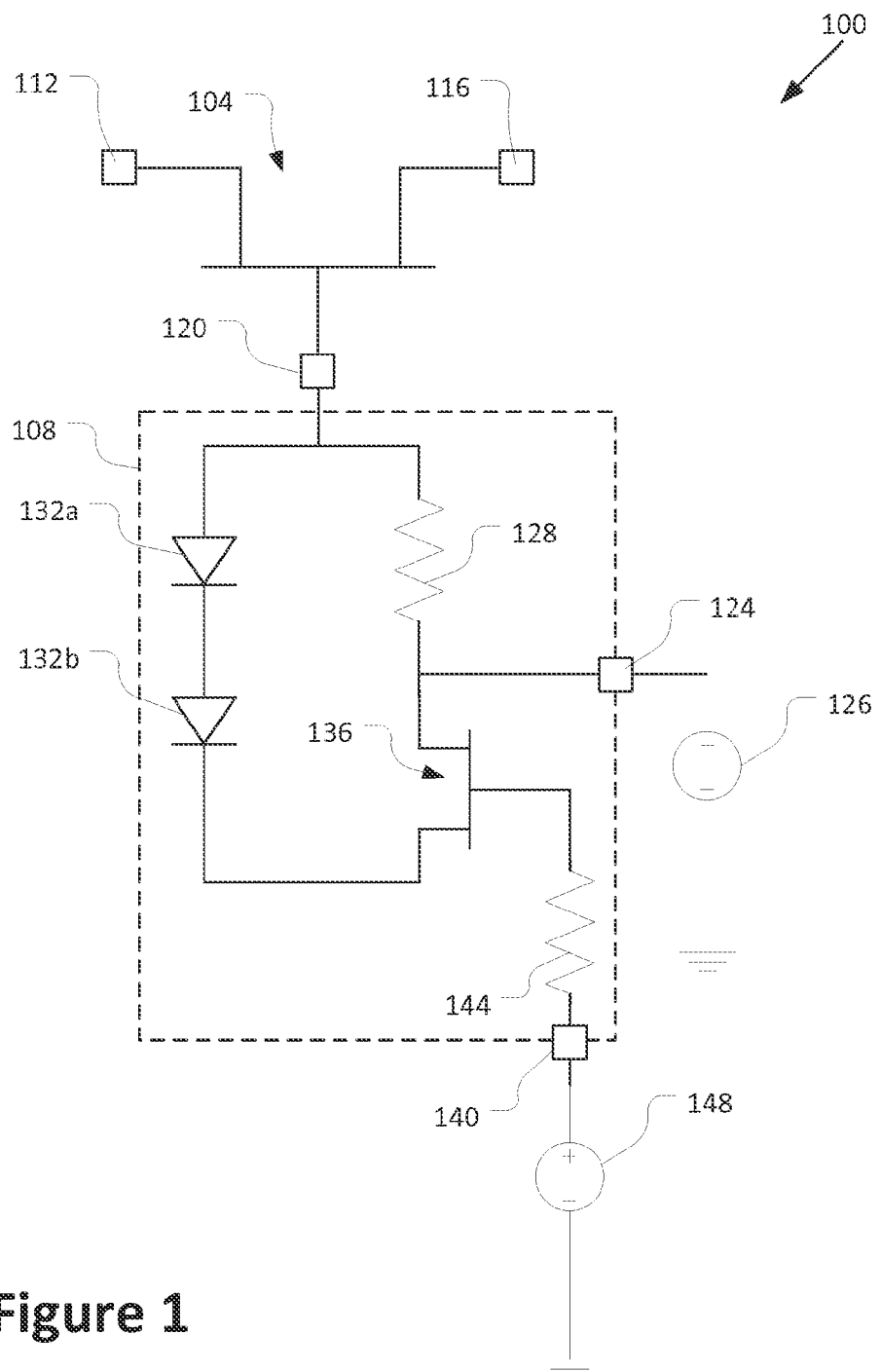
FIG. 1 illustrates a circuit diagram of a switching device in accordance with various embodiments.

FIG. 1 illustrates a switching circuit 100 in accordance with various embodiments. Switching circuit 100 (also referred to as circuit 100) may include a transistor 104 coupled with a bias circuit 108. In some embodiments, the transistor 104 may be a field effect transistor (FET). The transistor 104 may include a drain terminal 112, a source terminal 116, and a gate terminal 120. In some embodiments, the transistor 104 may be an n-type FET. Additionally, or alternatively, the transistor 104 may be a depletion mode FET. In some embodiments, the transistor 104 may be a gallium nitride (GaN) or a gallium arsenide (GaAs) FET.

The switching circuit 100 may further include a control terminal 124 that is to receive a control signal (e.g., a control voltage) to switch the transistor 104 between a first state and a second state to facilitate switching of a transmission signal (e.g., a radio frequency (RF) signal). For example, in some embodiments, the transistor 104 may be off in the first state and on in the second state. The transistor 104 may receive the transmission signal at the drain terminal 112 and pass the transmission signal to the source terminal 116 if the transistor 104 is on. The transistor 104 may prevent the passage of the transmission signal between the drain terminal 112 and the source terminal 116 if the transistor 104 is off.

In some embodiments, the transistor 104 may be coupled in series with a transmission path to selectively pass the transmission signal from an input port to an output port (e.g., for transmission by an antenna and/or other structure). In other embodiments, the transistor 104 may be coupled in shunt with the transmission path to selectively pass the transmission signal from the input port to a ground terminal (e.g., to divert the transmission signal and prevent it from being passed to the output port). As discussed below and shown in FIG. 3, some embodiments may include a switching device that includes a series transistor coupled in series with the transmission path and a shunt transistor coupled in shunt with the transmission path. In a first state of the switching module, the series transistor may be on and the shunt transistor may be off to pass the transmission signal to the output port. In a second state of the switching module, the series transistor may be off and the shunt transistor may be on to prevent the transmission signal from passing to the output port.

In various embodiments, the control signal may be switchable between a first value and a second value. The control signal may have the first value to turn the transistor 104 off, and may have the second value to turn the transistor 104 on. In some embodiments, the first and second values may be direct current (DC) voltages. For example, in some embodiments, the first value may be a negative DC voltage to turn the transistor 104 off, and the second value may be 0 volts (e.g., a ground voltage) to turn the transistor 104 on. In one non-limiting embodiment, the first value of the control signal may be about −20 volts to about −48 volts to turn the transistor 104 off. Such a control signal may be employed, for example, when the transistor 104 is a depletion mode GaN FET.

In some embodiments, the control signal may be provided by a power supply 126 coupled with the control terminal 124. In some embodiments, the power supply 126 may be coupled with a ground potential to provide the second value of the control signal and coupled with a negative voltage supply to provide the first value of the control signal.

In various embodiments, the bias circuit 108 may be coupled between the gate terminal 120 of the transistor 104 and the control terminal 124. The bias circuit 108 may include a gate resistor 128 coupled with and between the gate terminal 120 and the control terminal 124. The bias circuit 108 may further include one or more diodes 132a-b coupled in parallel with the gate resistor 128 between the gate terminal 120 and the control terminal 124. The diodes 132a-b may allow leakage current to pass from the gate terminal 120 to the control terminal 124 through the diodes 132a-b. The diodes 132a-b may be oriented with a forward direction of the diodes 132a-b coupled toward the control terminal 124 and a reverse direction of the diodes 132a-b coupled toward the gate terminal 120.

In some embodiments, the bias circuit 108 may further include a switch 136 (e.g., a FET) coupled with the one or more diodes 132a-b to selectively couple the one or more diodes 132a-b in parallel with the gate resistor 128 when the transistor 104 is in the first state (e.g., off). For example, the switch 136 may be on (e.g., conducting current between the control terminal 124 and the diodes 132a-b) when the transistor 104 is off, and the switch 136 may be off (e.g., preventing current from passing between the control terminal 124 and the diodes 132a-b) when the transistor 104 is on. In some embodiments, the switch 136 may be coupled between the one or more diodes 132a-b and the control terminal 124. In other embodiments, the switch 136 may be coupled between the one or more diodes 132a-b and the gate terminal 120.

When the switch 136 is on, the diodes 132a-b may be conductively coupled between the gate terminal 120 and the control terminal 124. When the leakage current at the gate terminal 120 is relatively low, the diodes 132a-b may present a higher impedance than the gate resistor 128, and the leakage current may flow between the gate terminal 120 and the control terminal 124 through the gate resistor 128. However, when the leakage current at the gate terminal 120 exceeds a threshold current, the diodes 132a-b may present a lower impedance than the gate resistor 128, and the leakage current may pass from the gate terminal 120 to the control terminal 124 through the diodes 132a-b. The diodes 132a-b may provide a voltage drop between the gate terminal 120 and the control terminal 124 approximately equal to the sum of the turn-on voltages of the diodes 132a-b. For example, in some embodiments, the turn-on voltage of the individual diodes 132a-b may be about 1.6 volts. Accordingly, in embodiments in which the bias circuit 108 includes two diodes 132a-b, the diodes 132a-b may provide a voltage drop of about 3.2 volts between the gate terminal 120 and the control terminal 124. The voltage drop provided by the diodes 132a-b may be substantially constant for leakage currents above the threshold current.

In contrast, in prior bias circuits that do not include diodes in parallel with the gate resistor of the switching transistor, all of the leakage current is passed through the gate resistor. Accordingly, when the switching transistor is off and the control signal is a negative voltage, the voltage drop from the gate terminal to the control terminal across the gate resistor increases linearly with increasing leakage current, thereby causing the voltage level at the gate terminal to become less negative. If the leakage current exceeds a leakage limit, the increased voltage level at the gate terminal caused by the leakage current may cause the switching transistor to turn on. Accordingly, the bias circuit 108 may allow the circuit 100 to operate with higher leakage currents than prior switching circuits.

Additionally, the diodes 132a-b may rectify the RF signal that is present at the drain terminal 112 and convert the RF signal to additional negative voltage at the gate terminal 120. Accordingly, the diodes 132a-b may make the gate voltage at the gate terminal 120 more negative than if the diodes were not coupled between the gate terminal 120 and the control terminal 124. The rectification provided by the diodes 132a-b may increase the compression point or power handling of the switching circuit 100 (e.g., the amount of RF power of the RF signal at the drain terminal 112 that may be switched by the FET 104 without significant insertion loss, such as insertion loss of 0.2 decibels or more). Additionally, the increased power handling provided by the diodes 132a-b may be substantially maintained as the leakage current increases (e.g., at a leakage current of 1 milliamp/millimeter (mA/mm), 1.5 mA/mm, 2 mA/mm, or more). In contrast, the power handling of switching circuits without diodes coupled between the gate terminal and the control terminal typically decreases as leakage current increases.

In various embodiments, the increased power handling provided by the bias circuit 108 may allow the control signal to have a less negative voltage for the first value while providing a given amount of RF power handling (e.g., for a given compression point), compared with a bias circuit that does not include diodes in parallel with the gate transistor. Alternatively, or additionally, the bias circuit 108 may provide increased RF power handling for a given first value of the control signal. In various embodiments, the bias circuit 108 may be used in the circuit 100 for the benefit of increased RF power handling even when the leakage current benefits of the bias circuit 108 are not needed (e.g., when the FET process being used in circuit 100 has a low gate leakage current). Alternatively, the bias circuit 108 may be used in the circuit 100 to manage high leakage current even in situations when the increased RF power handling is not needed.

However, in some embodiments, the additional negative voltage at the gate terminal 120 caused by the rectification by the diodes 132a-b may not be desired when the control signal has the second value to turn the transistor 104 on. For example, when the second value of the control signal is 0 volts to turn the transistor 104 on, additional negative voltage at the gate terminal 120 from rectification may cause the transistor 104 to turn off (e.g., at high RF power levels). Accordingly, the switch 136 may be included in the circuit 100 to selectively couple the diodes 132a-b in parallel with the gate resistor 128 between the gate terminal 120 and the control terminal 124. The switch 136 may be off when the transistor 104 is on. Accordingly, the switch 136 may disconnect the diodes 132a-b from the control terminal 124 and/or gate terminal 120, to prevent current from passing through the diodes 132a-b between the gate terminal 120 and the control terminal 124, when the control signal has the second value and the transistor 104 is on. The leakage current at the gate terminal 120 may not significantly affect the performance of the circuit 100 when the transistor 104 is on since the drain terminal 112, source terminal 116, and gate terminal 120 of the transistor 104 may all be at a ground potential.

In some embodiments, the switch 136 may be a transistor, such as a FET. A switch bias terminal 140 may be coupled with a gate terminal of the switch 136 (e.g., via a resistor 144) to receive a constant bias voltage and pass the constant bias voltage to the gate terminal of the switch 136. In some embodiments, the constant bias voltage may be provided by a power supply 148 coupled with the switch bias terminal 140.

In some embodiments, the constant bias voltage received by the switch bias terminal 140 may have a value equal to the minimum value of the control voltage received at the control terminal 124. For example, in some embodiments, the value of the constant bias voltage may be equal to a value of the control voltage when the first transistor is off (e.g., a negative voltage).

In some embodiments, a drain terminal of the switch 136 may be coupled with the control terminal 124, and a source terminal of the switch 136 may be coupled with the diode 132b. Accordingly, with the constant bias voltage received at the gate terminal of the switch 136, the switch 136 may turn on or off responsive to the control signal received at the control terminal 124. That is, the switch 136 may be on when the transistor 104 is off and may be off when the transistor 104 is on.

In various embodiments, the bias circuit 108 may include any suitable number of one or more diodes 132a-b, such as one, two, three, or more diodes. The number of diodes may be selected based on the amount of leakage current that the bias circuit 108 is designed to pass through the diodes 132a-b, the threshold voltage of the FET technology utilized, the minimum RF impedance required at the gate terminal 120, and/or the magnitude of negative control signal available.

Figure 2:
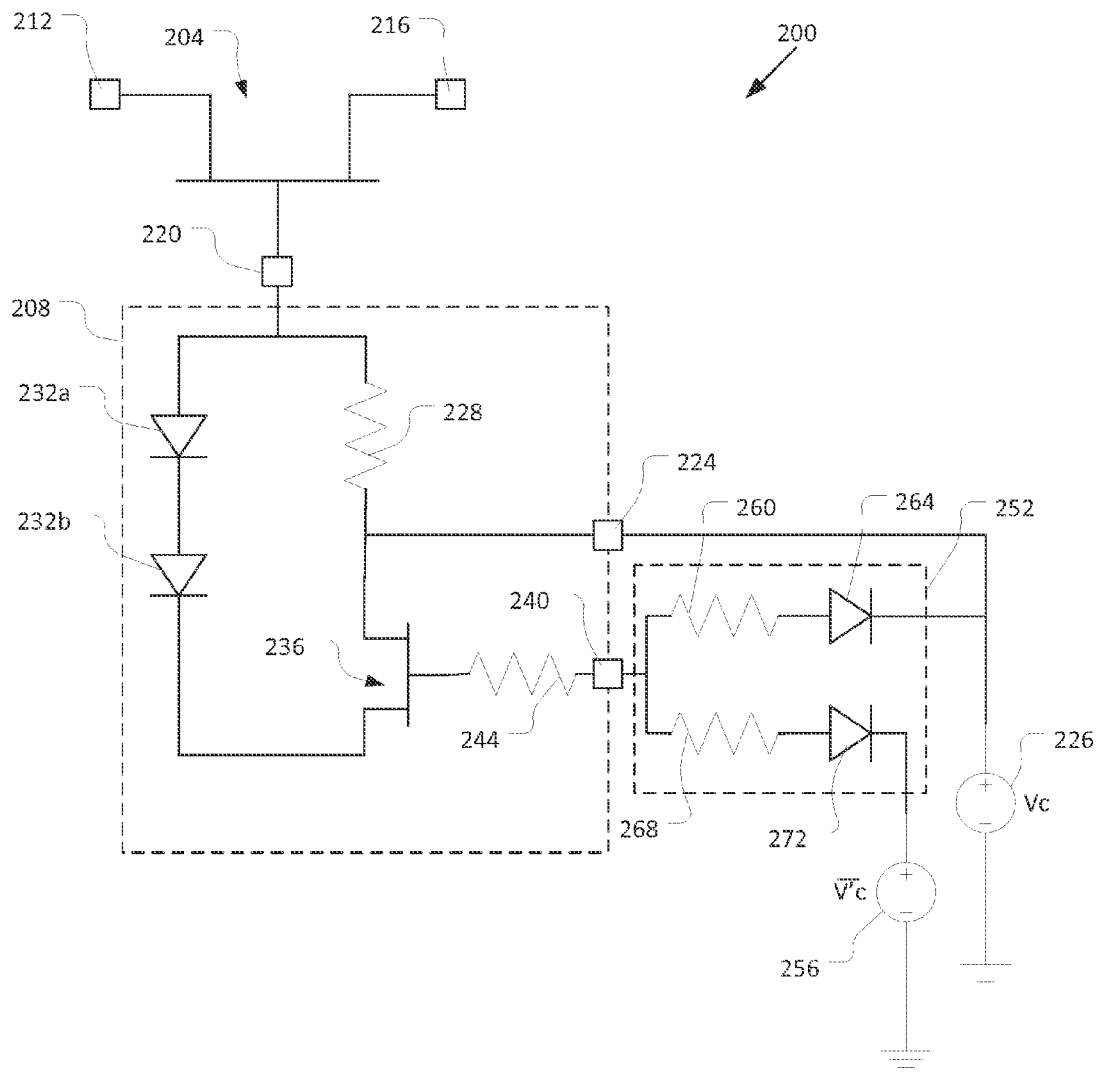
FIG. 2 illustrates a circuit diagram of another switching device in accordance with various embodiments.

FIG. 2 illustrates another switching circuit 200 (also referred to as "circuit 200") in accordance with various embodiments. The switching circuit 200 may include a transistor 204 and a bias circuit 208 similar to the transistor 104 and bias circuit 108, respectively, of FIG. 1. The bias circuit 208 may include a gate resistor 228, one or more diodes 232a-b, and a switch 236 that may be similar to the gate resistor 128, one or more diodes 132a-b, and switch 136, respectively, of bias circuit 108. A control terminal 224 may be coupled with the bias circuit 208 (e.g., between the gate resistor 228 and the switch 236). The control terminal 224 may receive a DC control voltage Vc from a power supply 226. The control voltage Vc may have a first value to turn the FET 204 off and the switch 236 on, and a second value to turn the FET 204 on and the switch 236 off. For example, in some embodiments, the first value may be a negative DC voltage and the second value may be a ground (0) voltage.

The switching circuit 200 may further include a switch bias terminal 240 coupled with a gate terminal of the switch 236 (e.g., via resistor 244). A gate circuit 252 may be coupled with the switch bias terminal 240 to provide a constant bias voltage to the switch bias terminal 240. The constant bias voltage may have a value equal to a lesser of the first and second values of the control voltage Vc (e.g., the first value when the first value is a negative voltage). In some embodiments, the gate circuit 252 may generate the constant bias voltage based on the control voltage Vc and a complementary voltage V'c that is complementary to the control voltage Vc (e.g., V'c may have the first value when Vc has the second value and may have the second value when Vc has the first value). The complementary voltage V'c may be provided by a power supply 256.

In some embodiments, the gate circuit 252 may form a NOR gate to output the constant bias voltage with a value equal to the lower voltage of the control voltage Vc or the complementary voltage V'c. For example, the gate circuit 252 may include a resistor 260 and a diode 264 coupled in series with one another between the switch bias terminal 240 and the power supply 226 and may further include a resistor 268 and a diode 272 coupled in series with one another between the switch bias terminal 240 and the power supply 256.

Figure 3:
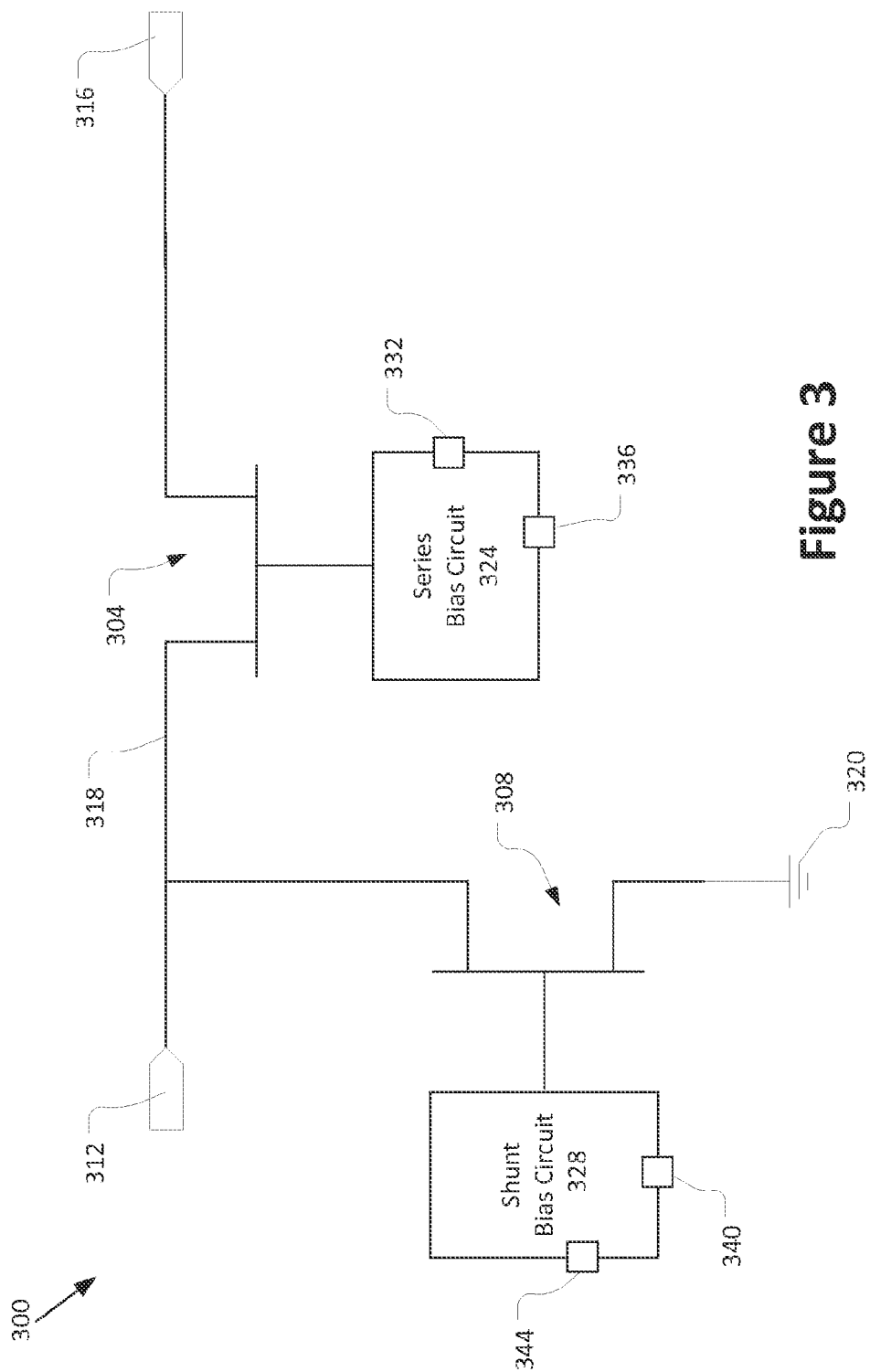
FIG. 3 illustrates a circuit diagram of a single-pole, single-throw switch in accordance with various embodiments.

FIG. 3 illustrates a switching circuit 300 (also referred to as a switching device or circuit 300) including a series transistor 304 and a shunt transistor 308 in accordance with various embodiments. The circuit 300 may be switchable between a first state and a second state. The circuit 300 may include an input terminal 312 that receives an RF signal (e.g., from a transmitter). The circuit 300 may pass the RF signal to an output terminal 316 if the circuit 300 is in the first state and may pass the RF signal to a ground terminal 320 if the circuit 300 is in the second state. In some embodiments, the output terminal 316 may be coupled with an antenna (not shown) for transmitting the RF signal.

The series transistor 304 may be coupled in series between the input terminal 312 and the output terminal 316. The series transistor 304 may also be described as being connected in series with a transmission path 318 running from the input terminal 312 to the output terminal 316. The series transistor 304 may selectively pass the RF signal to the output terminal if the circuit 300 is in the first state.

The shunt transistor 308 may be coupled between the input terminal 312 and the ground terminal 320. The shunt transistor 308 may also be described as being in shunt with the transmission path 318 and/or input terminal 312. The shunt transistor 308 may selectively short the RF signal to the ground terminal 320 if the circuit 300 is in the second state (thereby preventing the RF signal from passing to the output terminal 316).

The circuit 300 may further include a series bias circuit 324 coupled with a gate terminal of the series transistor 304 and a shunt bias circuit 328 coupled with a gate terminal of the shunt transistor 308. The series bias circuit 324 and/or shunt bias circuit 328 may be similar to the bias circuit 108 or bias circuit 208 described herein. The series bias circuit 324 may include a control terminal 332 to receive a series control signal and a switch bias terminal 336 to receive a constant bias voltage. The shunt bias circuit 328 may include a control terminal 340 to receive a shunt control signal and a switch bias terminal 344 to receive a constant bias voltage. The series control signal may be complementary to the shunt control signal. In some embodiments, the constant bias voltage received by the switch bias terminal 336 may be the same as the constant bias voltage received by the switch bias terminal 344.

It will be apparent that in some embodiments, the series transistor 304 may be included in a stack of a plurality of transistors coupled between the input terminal 312 and the output terminal 316 (e.g., a plurality of series FETs). Additionally, or alternatively, the shunt transistor 308 may be included in a stack of a plurality of transistors coupled between the input terminal 312 and the ground terminal 320 (e.g., a plurality of shunt FETs).

Figure 4:
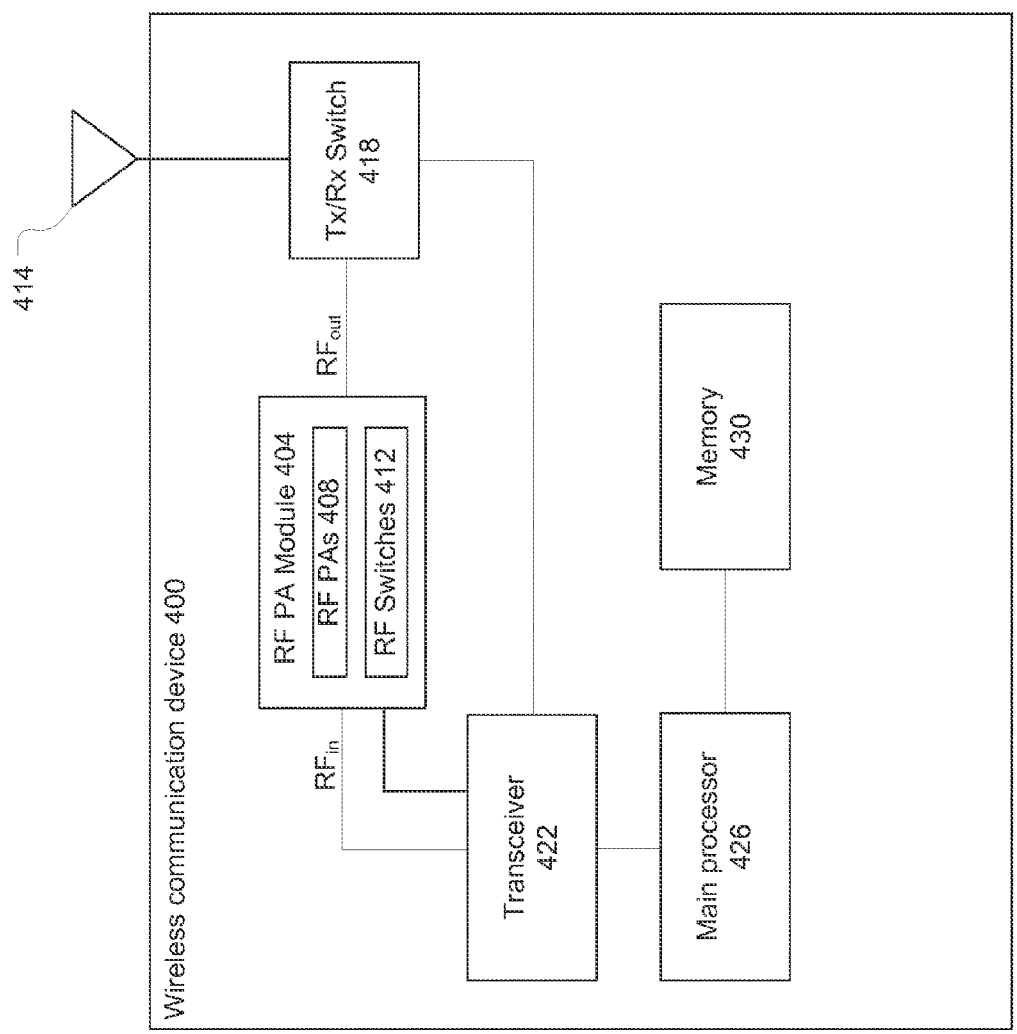
FIG. 4 is a block diagram of an exemplary wireless communication device in accordance with various embodiments.

A block diagram of an exemplary wireless communication device 400 is illustrated in FIG. 4 in accordance with some embodiments. Wireless communication device 400 may have an RF power amplifier (PA) module 404 including one or more RF PAs 408. RF PA module 404 may further include one or more RF switches 412 coupled with one or more of the RF PAs 408. The RF switches 412 may be similar to and/or include switching circuits 100, 200, and/or 300.

In addition to the RF PA module 404, the wireless communication device 400 may have an antenna structure 414, a Tx/Rx switch 418, a transceiver 422, a main processor 426, and a memory 430 coupled with each other at least as shown. While the wireless communication device 400 is shown with transmitting and receiving capabilities, other embodiments may include devices with only transmitting or only receiving capabilities. While RF switches 412 are shown as included in RF PA module 404, in other embodiments, RF switches 412 may be included in other components of the wireless communication device 400, such as Tx/Rx switch 418 and/or transceiver 422, in addition to or instead of RF PA module 404.

In various embodiments, the wireless communication device 400 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 426 may execute a basic operating system program, stored in the memory 430, in order to control the overall operation of the wireless communication device 400. For example, the main processor 426 may control the reception of signals and the transmission of signals by transceiver 422. The main processor 426 may be capable of executing other processes and programs resident in the memory 430 and may move data into or out of memory 430, as desired by an executing process.

The transceiver 422 may receive outgoing data (e.g., voice data, web data, e-mail, signaling data, etc.) from the main processor 426, may generate RF input ($RF_{in}$) signal(s) to represent the outgoing data, and provide the $RF_{in}$ signal(s) to the RF PA module 404. The transceiver 422 may also control the RF PA module 404 to operate in selected bands and in either full-power or backoff-power modes. In some embodiments, the transceiver 422 may generate the $RF_{in}$ signal(s) using orthogonal frequency-division multiplexing (OFDM) modulation.

The RF PA module 404 may amplify the $RF_{in}$ signal(s) to provide RF output ($RF_{out}$) signal(s) as described herein. The $RF_{out}$ signal(s) may be forwarded to the Tx/Rx switch 418 and then to the antenna structure 414 for an over-the-air (OTA) transmission. In some embodiments, Tx/Rx switch 418 may include a duplexer. In a similar manner, the transceiver 422 may receive an incoming OTA signal from the antenna structure 414 through the Tx/Rx switch 418. The transceiver 422 may process and send the incoming signal to the main processor 426 for further processing.

The one or more RF switches 412 may be used to selectively pass RF signal(s) (e.g., $RF_{in}$ signal(s) and/or $RF_{out}$ signal(s)) to, from, and/or within components of wireless communication device 400.

In various embodiments, the antenna structure 414 may include one or more directional and/or omnidirectional antennas, including, e.g., a dipole antenna, a monopole antenna, a patch antenna, a loop antenna, a microstrip antenna, or any other type of antenna suitable for OTA transmission/reception of RF signals.

Those skilled in the art will recognize that the wireless communication device 400 is given by way of example and that, for simplicity and clarity, only so much of the construction and operation of the wireless communication device 400 as is necessary for an understanding of the embodiments is shown and described. Various embodiments contemplate any suitable component or combination of components performing any suitable tasks in association with wireless communication device 400, according to particular needs. Moreover, it is understood that the wireless communication device 400 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
a first transistor having a first gate terminal and configured to facilitate switching of a radio frequency (RF) signal;
a second transistor having a second gate terminal configured to receive a constant bias voltage;
a gate resistor coupled between the first gate terminal and a control terminal;
a plurality of diodes, wherein the second transistor and the plurality of diodes are coupled in series between the first gate terminal and the control terminal; and
a gate circuit coupled with the second gate terminal and configured to generate the constant bias voltage based on a first control voltage, and a second control voltage that is complementary to the first control voltage.

2. The circuit of claim 1, wherein:
the circuit is configured to receive the first control voltage to switch the transistor between a first state and a second state; and
the second transistor is configured to selectively couple the plurality of diodes in parallel with the gate resistor when the first transistor is in the first state.

3. The circuit of claim 1, wherein the first transistor is a gallium nitride (GaN) transistor.

4. The circuit of claim 1, wherein the first transistor is a series transistor coupled in series with a transmission path of the RF signal, wherein the gate resistor and the plurality of diodes are included in a first bias circuit, and wherein the apparatus further includes:
a shunt transistor coupled in shunt with the transmission path, the shunt transistor having a gate terminal; and
a second bias circuit coupled with the gate terminal of the shunt transistor.

5. A radio frequency (RF) switching apparatus comprising:
a transistor having a gate terminal;
a control terminal coupled with the gate terminal, the control terminal to receive a first control voltage to turn the transistor on or off to facilitate switching of an RF signal; and
a bias circuit coupled between the gate terminal and the control terminal, the bias circuit including a gate resistor coupled between the gate terminal and the control terminal;
the bias circuit to selectively provide a conductive path between the gate terminal and the control terminal, around the gate resistor and through one or more diodes, when the transistor is off; and
the bias circuit configured to receive a constant bias voltage based on the first control voltage and a second control voltage that is complementary to the first control voltage.

6. The apparatus of claim 5, wherein the transistor is a first transistor and the gate terminal is a first gate terminal, and wherein the bias circuit includes a second transistor coupled with the one or more diodes to selectively conductively couple the one or more diodes in parallel with the gate resistor when the transistor is off.

7. The apparatus of claim 6, wherein a second gate terminal of the second transistor is configured to receive the constant bias voltage having a value equal to a value of the first control voltage when the first transistor is off.

8. The apparatus of claim 7, wherein the apparatus further includes a gate circuit coupled with the second gate terminal of the second transistor, the gate circuit to generate the constant bias voltage.

9. The apparatus of claim 5, wherein the first control voltage has a value of about 0 volts when the transistor is on and a negative voltage when the transistor is off.

10. The apparatus of claim 5, wherein the transistor is a series transistor coupled in series with a transmission path of the RF signal, wherein the gate resistor and the one or more diodes are included in a first bias circuit, and wherein the apparatus further includes:
 a shunt transistor coupled in shunt with the transmission path, the shunt transistor having a gate terminal; and
 a second gate circuit coupled with the gate terminal of the shunt transistor.

11. The apparatus of claim 5, wherein the one or more diodes include a plurality of diodes coupled in series with one another between the gate terminal and the control terminal.

12. A system comprising:
 an input port to receive a radio frequency (RF) signal;
 an output port;
 a series transistor coupled in series between the input port and the output port to selectively pass the RF signal to the output port when the series transistor is on;
 a series control terminal coupled with a gate terminal of the series transistor, the series control terminal to receive a series control voltage to turn the series transistor on or off;
 a series bias circuit coupled with the gate terminal of the series transistor, the series bias circuit including:
  a series gate resistor coupled between the gate terminal of the series transistor and the series control terminal;
  one or more diodes coupled in parallel with the series gate resistor between the gate terminal of the series transistor and the series control terminal; and
  a series switch coupled in series with the one or more diodes between the gate terminal of the series transistor and the series control terminal to selectively conductively couple the one or more diodes in parallel with the series gate resistor responsive to the series control voltage;
 a shunt transistor coupled in shunt with a transmission path between the input port and the output port;
 a shunt control terminal coupled with a gate terminal of the shunt transistor, the shunt control terminal to receive a shunt control voltage to turn the shunt transistor on or off, the shunt control voltage being complementary to the series control voltage;
 a shunt bias circuit comprising a shunt switch; and
 a plurality of individual gate circuits coupled to the series switch and the shunt switch, such that each of the plurality of individual gate circuits is configured to pass a constant bias voltage to the series switch and the shunt switch, wherein the constant bias voltage has a value equal to the lesser of a value of the series control voltage and a value of the shunt control voltage.

13. The system of claim 12, further comprising:
 the shunt bias circuit coupled with the gate terminal of the shunt transistor, the shunt bias circuit including:
 a shunt gate resistor coupled between the gate terminal of the shunt transistor and the shunt control terminal;
 one or more diodes coupled in parallel with the shunt gate resistor between the gate terminal of the shunt transistor and the shunt control terminal; and
 the shunt switch coupled in series with the one or more diodes between the gate terminal of the shunt transistor and the shunt control terminal to selectively conductively couple the one or more diodes of the shunt bias circuit with the shunt control terminal responsive to the shunt control voltage.

14. The system of claim 13, wherein the switches of the series bias circuit and the shunt bias circuit include transistors, wherein the system further includes the plurality of individual gate circuits coupled with a gate terminal of the respective transistors of the switches, the individual gate circuits to:
 receive the series control voltage and the shunt control voltage; and
 pass the constant bias voltage to the gate terminal of each transistor of the switches.

15. The system of claim 12, wherein the one or more diodes include a plurality of diodes coupled in series with one another between the gate terminal of the series transistor and the series control terminal.

16. The system of claim 12, wherein the series transistor is a gallium nitride (GaN) transistor.

17. A user equipment including the system of claim 12 to switch the RF signal for transmission over a wireless communication network.

* * * * *

UNITED STATES PATENT AND TRADEMARK OFFICE
CERTIFICATE OF CORRECTION

PATENT NO. : 9,768,770 B2  
APPLICATION NO. : 14/196987  
DATED : September 19, 2017  
INVENTOR(S) : Charles F. Campbell Page 1 of 1

It is certified that error appears in the above-identified patent and that said Letters Patent is hereby corrected as shown below:

In the Claims

In Column 8, Line 34, replace "to switch the transistor" with --to switch the first transistor--.

In Column 8, Line 45, replace "apparatus further includes" with --circuit further includes--.

Signed and Sealed this
Thirtieth Day of April, 2019

Andrei Iancu
*Director of the United States Patent and Trademark Office*